US000001883H

United States Statutory Invention Registration [19]

[11] Reg. Number: H1,883

Kub et al.

[45] Published: Oct. 3, 2000

[54] CONTINUOUS-TIME ADAPTIVE LEARNING CIRCUIT

[75] Inventors: Francis J. Kub, Arnold; Eric W. Justh, Greenbelt, both of Md.

[73] Assignee: The United States of America as represented by the Secretary of the Navy, Washington, D.C.

[21] Appl. No.: 07/984,111

[22] Filed: Dec. 3, 1992

[51] Int. Cl.[7] ..... H03H 7/30

[52] U.S. Cl. ..... 375/233

[58] Field of Search ..... 307/529, 521, 307/446; 328/160; 375/30, 31, 14, 13

[56] References Cited

U.S. PATENT DOCUMENTS

| | | | |
|---|---|---|---|
| 3,805,091 | 4/1974 | Colin | 307/521 |
| 4,156,283 | 5/1979 | Gilbert | 328/160 |
| 4,328,585 | 5/1982 | Monsen | 325/13 |
| 4,978,873 | 12/1990 | Shoemaker | 328/160 |
| 5,034,628 | 7/1991 | Matsuzawa et al. | 302/446 |
| 5,107,149 | 4/1992 | Platt et al. | 328/160 |
| 5,117,205 | 5/1992 | Nauta | 307/521 |
| 5,164,962 | 11/1992 | Nakai et al. | 375/13 |

OTHER PUBLICATIONS

S.T. Dupuie, "High Frequency Continuous Time Filter in CMOS Technology," (SRC Technical Report T91043, Master's Thesis at Ohio State University, Apr., 1991).

*Primary Examiner*—Daniel T. Pihulic
*Attorney, Agent, or Firm*—Edward F. Miles; Thomas E. McDonnell

[57] ABSTRACT

A continuous-time multiplier-integrator-multiplier circuit in which the integrator is a transconductance-C circuit. This permits the integrators to have long time constants despite being tightly fabricated on an integrated semiconductor chip. The multipliers can preferably be Gilbert multipliers, to improve circuit frequency response.

8 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

CONTINUOUS-TIME ADAPTIVE LEARNING CIRCUIT

BACKGROUND OF THE INVENTION

Adaptive filter circuits which employ the least mean square learning algorithm have widespread applications, which are continually growing in number. These adaptive filters employ a number of circuit legs which sequentially multiply a time delayed input signal with an error signal, integrate the product, and multiply the integrated product with the input time delayed signal. The longer the time constant of the integrator circuit, the more desirable is the integrator because it can effectively integrate over longer time periods. Long integrator time constants are useful for adaptive filter circuits because they increase the range of applications for which the adaptive filter can be used. For example, the smallest notch filter bandwidth that can be achieved by an adaptive filter is often determined by the length of the time constant. Conventional integrator circuits, such as simple RC networks cannot produce sufficiently long time constants, generally equal to RC, for many applications because the physical size of the capacitors would necessarily be too large for integrated semiconductor chips; and it is difficult to fabricate high value resistors with conventional integrated circuit technology.

Additionally, many integrator circuits when used in integrated circuits have unacceptably poor high frequency response for many adaptive learning applications, further limiting the usefulness of these circuits. For example, the frequency of operation of switched capacitor integrators is limited by the need for high amplifier bandwidth to provide sufficient settling accuracy for sampled-data signal processing.

SUMMARY OF THE INVENTION

Accordingly, an object of the invention is permit fabrication of integrator circuits having a large time constant without use of an RC network.

Another object is to provide continuous-time (i.e. not sampled data) multiplier-integrator-multiplier circuit legs having good high frequency performance.

Another object is to do the foregoing in a manner which will permit realization of such circuit legs in monolithic semiconductor chips, using state of the art semiconductor fabrication techniques.

In accordance with these and other objects made apparent hereinafter, the invention concerns a continuous-time multiplierintegrator-multiplier circuit in which the integrator is a transconductance-C circuit, preferably fabricated by MOS (especially CMOS) techniques, or bipolar fabrication techniques. A transconductance-C circuit is composed of a transconductor circuit which is loaded by a capacitor. A transconductor circuit converts a voltage signal into a current signal, i.e. it is a voltage-to-Serial current transducer. Thus a transconductance-C circuit functions as an integrator by accepting an input voltage signal, transducing this voltage signal to a current signal with this current signal being integrated on a capacitor that loads the output of the transconductor circuit. Transconductance-C circuits are a class of circuits in which active semiconductor devices (FET's in MOS technology, bipolar transistors in bipolar technology) effectively form a real transconductance which is loaded by a parallel capacitor. Transconductance-C circuits are known. Heretofore, they have been used to implement high frequency analog signal filters. (For a general discussion of transconductance-C circuits, see S.T. Dupuie, High Frequency Continuous-Time Filter in CMOS Technology, which is incorporated herein by reference.) The inventors, however, have realized that Transconductance-C circuits can be used advantageously as an integrator in the circuit legs discussed above. The transconductance of the transconductance circuit is determined primarily by the current flowing through the transistors and transistor parameters, rather than by bulk size of material. A small current supplied to the transconductance-C circuit will generally result in a small transconductance value for the circuit. The time constant of a transconductance-C integrator is given by the product the loading capacitor and the inverse of the transconductance of the circuit. (This time constant is conventionally referred to in the literature as $C/g_m$.) Because the effective trasnconductance is now controlled by transistor parameters, and the current supplied to the transconductance-C circuit, rather than bulk size, a transconductance-C circuit can have a large time constant despite being of very small size. Thus a large number of continuous-time multiplier-integrator-multiplier circuit legs can be tightly packed on a small integrated chip surface.

Additionally, another embodiment of the invention uses Gilbert multiplier circuits in the continuous-time multiplier-integratormultiplier legs, because Gilbert multipliers are readily fabricatable in FET or bipolar form, and have excellent high frequency response.

These and other objects are further understood from the following detailed description of particular embodiments of the invention. It is understood, however, that the invention is capable of extended application beyond the precise details of these embodiments. Changes and modifications can be made to the embodiments that do not affect the spirit of the invention, nor exceed its scope, as expressed in the appended claims. The embodiments are described with particular reference to the accompanying drawings, wherein:

DETAILED DESCRIPTION

Figure 1:
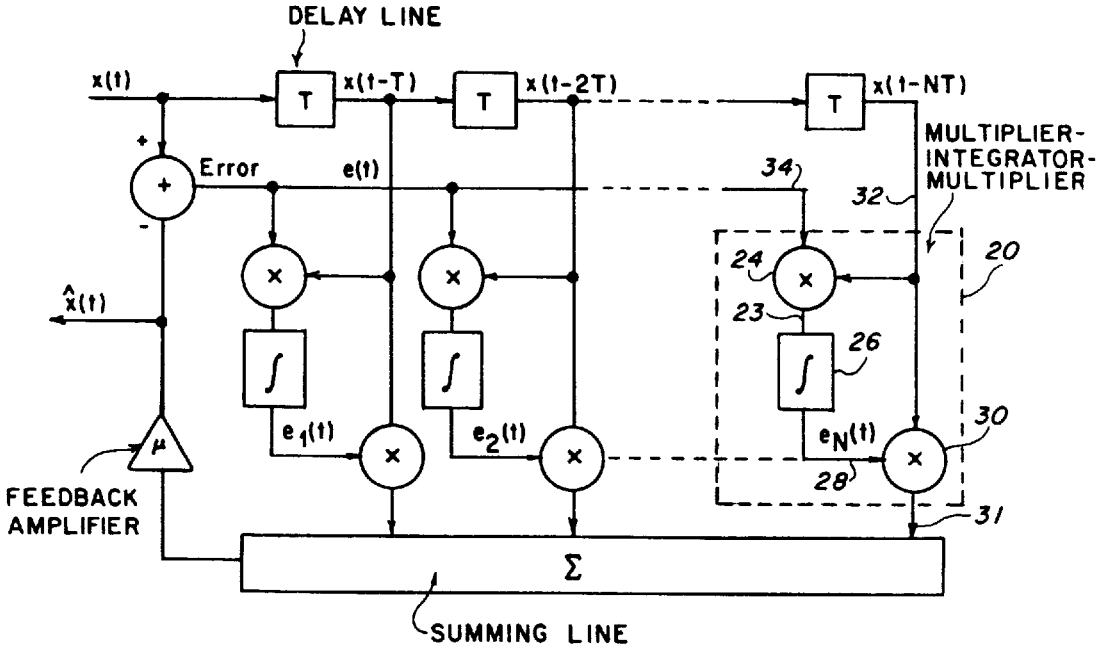
FIG. 1 is a schematic of a linear predictive adaptive filter employing the least mean square algorithm.

With reference to the drawing figures, wherein like numbers indicate like parts throughout the several views, FIG. 1 shows a linear predictive adaptive filter implementing the least mean square algorithm. The circuit contains a plurality of circuit legs 20, which are constituted by a multiplier 24, integrator 26, and a multiplier 30. Circuit leg 20 receives a time delayed input signal at 32, and an error signal at 34, multiplies these at 24, integrates the product at 26, resulting in a signal at 28, and multiplies the integral 28 by the time delayed signal 32 at 30. The output of 30 for circuit leg 20, as well as all other such legs in the adaptive filter, are summed and used to calculate the error signal, in a manner well known in the art.

Figure 2A:
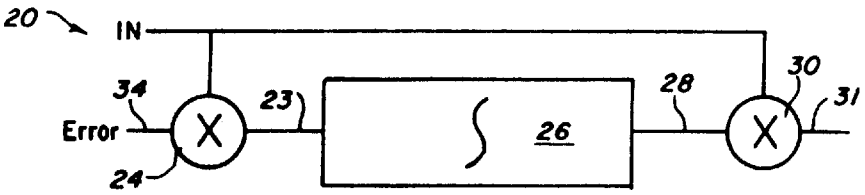
FIG. 2A is a block diagram of an embodiment of the invention.
Figure 2B:
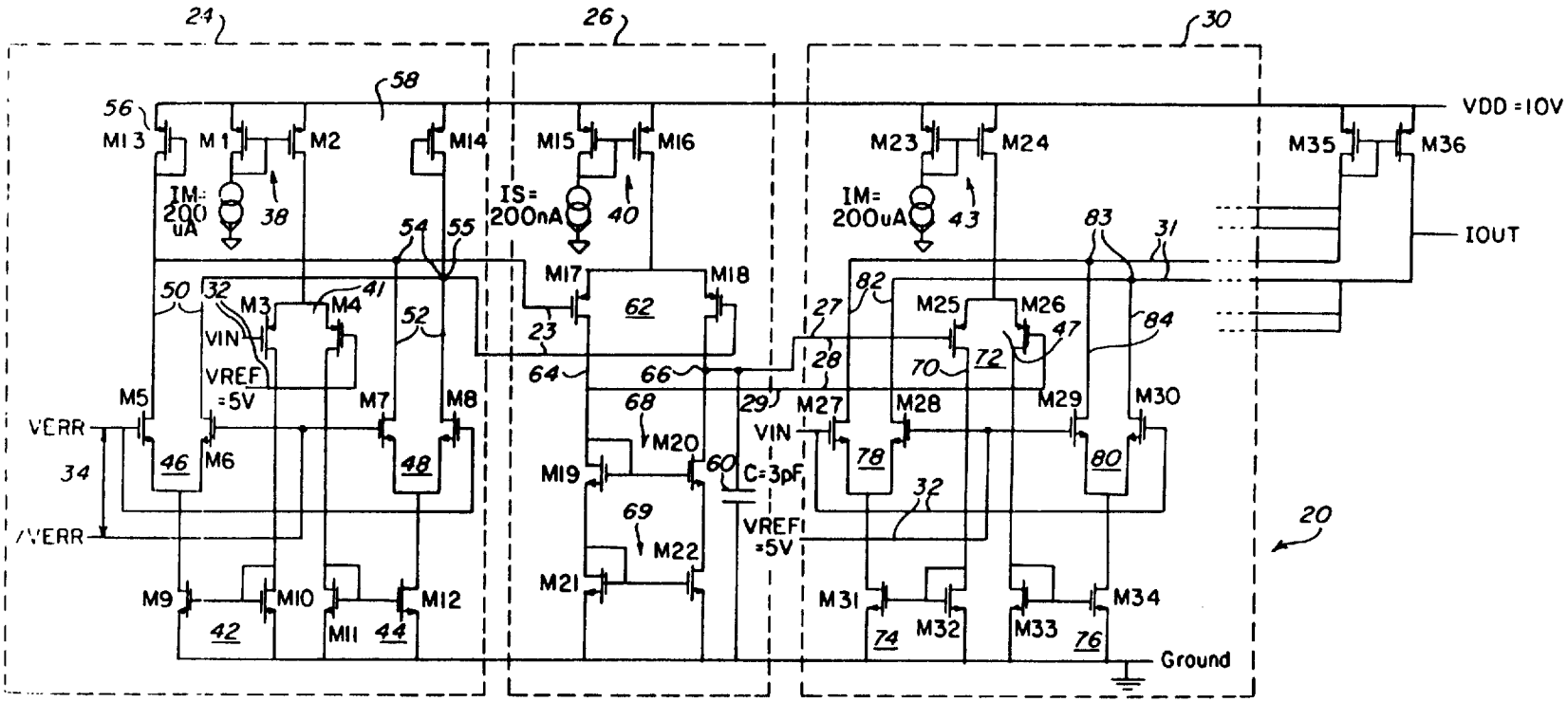
FIG. 2B is a circuit diagram of an embodiment of the invention.

FIGS. 2A and 2B show circuit leg 20 in more detail, FIG. 2A in the form of a block diagram, FIG. 2B in the form of a circuit schematic employing field effect transistors. With particular reference to FIG. 2B, multiplier 24 and 30 are widerange four quadrant Gilbert circuits, which are per se known. Integrator 26 is a transconductance circuit loaded by an integrating capacitor 60. FIG. 2B shows devices 20, 26, and 30 implemented by FET technology. The FET's of the circuit are biased by current sources and mirror circuits 38, 40, 43. The mirror circuits lend temperature stability to the biasing current.

The signal on line 32 enters the circuit 24, and drives FET differential pair 41, modulating the current from supply 38. The modulated signal from 41 enters mirror circuits 42, 44, which produce copied currents into differential FET pairs 46, 48. The signal at 34 which drives differential pairs 46 and 48, modulates the copied currents (from 41) at differential pair 46, 48, producing output currents at 50, 52, which are combined at 54 and 55 in the conventional manner for a Gilbert multiplier circuit, and dropped across respective load devices 56, 58, to produce voltages 23, which enter integrator 26 at 23.

Signal 23 drives differential FET pair 62, producing corresponding output currents at 64 and 66. Loading 64 and 66 is mirror circuits 68, 69, which cause the difference of the currents between output 64, 66, to appear at 27, and be integrated on grounded capacitor 60. The use of more than one mirror circuit at 68, 69 is to provide sufficient voltage level to properly bias at 28.

As capacitor 60 charges, the voltage across it appears between lines 27 and ground. The voltage signal on line 29 is used as a reference voltage for the voltage on line 27 and the difference between the voltages on lines 27 and 29 is a voltage signal 28. The circuit 26 acts to produce a zero differential voltage signal 28 when the differential voltage signal 23 is zero in steady state. Signal 28 enters a second Gilbert multiplier 30 via differential FET pair 47. Gilbert circuit 30 operates as does multiplier circuit 24. The voltage at 28 drives FET differential pair 47, modulating the current from supply 43. The resulting modulated output currents 70, 72 enter mirror circuits 74, 76, which produce copied currents into differential FET pairs 78, 80. The signal on line 32 which drives differential pairs 78, 80, modulates the copied currents from 47 at differential pair 78, 80, producing current outputs 83, 84, which are again combined in the conventional manner at 82, to produce output current at 31. These cirrents can be easily summed with other output currents of other multiplier-integratormultipliers 20 of FIG. 1.

The circuit of FIG. 2 uses FET's to form the multipliers and the transconductance circuit, and preferably the semiconductor chosen for the FET's is silicon because of the high density of circuit elements one can fabricate on one semiconductor monolith. However, the invention is not limited to implementation with silicon FET's. The requisite multiplier and transconductance-C circuits can be fabricated using bipolar transistors, or a combination of FET and bipolar transistors, using any semiconductor suitable to these devices (most notably silicon and III-IV semiconductors such as gallium arsenide).

Indeed the invention has been described in what is considered to be the most practical and preferred embodiments. It is recognized, however, that obvious modifications to these embodiments may occur to those with skill in this art. For example, the continuous-time multiplier-integrator-multiplier circuit leg is discussed above in conjunction with a linear predictive adaptive filter using a least means squares algorithm. This is done by way of example, rather than limitation. Such circuit legs have wider application, e.g. in adaptive filters for interference cancellation and in adaptive arrays for radar, sonar, and communications, as well as in artificial neural networks. As another example, one can certainly use multipliers other than Gilbert multipliers. One may, for instance, care more about circuit linearity than about frequency response, in which one may wish to use known multiplier circuits other than a Gilbert circuit. There is also a large number of possible circuits implementations among the general class of transconductance-C integrator. Accordingly, the scope of the invention is to be discerned solely by reference to the appended claims, wherein:

We claim:

1. A multiplier-integrator-multiplier circuit, comprising:

means for receiving a first and a second input signal;

first multiplier means for producing a first intermediate signal proportional to the product of said first and said second input signals;

integrator means for producing a second intermediate signal proportional to the integral of said first output signal;

second multiplier means for producing a third intermediate signal proportional to the product of said second signal and a third input signal;

wherein said integrator means is a transconductance-C circuit.

2. The circuit of claim 1, wherein said first multiplier, transconductance-C circuit, and said second multiplier circuit are in the form of a semiconductor monolith.

3. The circuit of claim 2, wherein the transistors of said first multiplier, transconductance-C circuit, and said second multiplier circuit are FET's.

4. The circuit of claim 2, wherein the transistors of said first multiplier, transconductance-C circuit, and said second multiplier circuit are bipolar transistors.

5. The circuit of claim 2, wherein the transistors of said first multiplier, transconductance-C circuit, and said second multiplier circuit are a combination of FET's and bipolar transistors.

6. The circuit of claim 1, wherein said first and said second multiplier means are each a four quadrant Gilbert multiplier circuit.

7. The circuit of claim 5, wherein said first and said second multiplier means are each a four quadrant Gilbert multiplier circuit.

8. (New) A multiplier-integrator-multiplier circuit, comprising:

means for receiving a first and second input signal;

first multiplier means for producing a first intermediate signal proportional to the product of said first and said second input signals;

integrator means for producing a second intermediate signal proportional to the integral of said first intermediate signal;

second multiplier means for producing a third intermediate signal proportional to the product of said second intermediate signal and a third input signal;

wherein said circuit further comprises means for causing said first and said third input signals to be substantially the same; and wherein said integrator means is a transconductance-C circuit.

* * * * *